(12) United States Patent
Miyagi et al.

(10) Patent No.: US 6,939,926 B2
(45) Date of Patent: Sep. 6, 2005

(54) PHENOL NOVOLAK RESIN, PRODUCTION PROCESS THEREOF, AND POSITIVE PHOTORESIST COMPOSITION USING THE SAME

(75) Inventors: Ken Miyagi, Kanagawa (JP); Yasuhide Ohuchi, Kanagawa (JP); Atsuko Hirata, Kanagawa (JP); Kousuke Doi, Kanagawa (JP); Hidekatsu Kohara, Kanagawa (JP); Toshimasa Nakayama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/773,294

(22) Filed: Feb. 9, 2004

(65) Prior Publication Data

US 2004/0167312 A1 Aug. 26, 2004

Related U.S. Application Data

(63) Continuation of application No. 09/793,958, filed on Feb. 28, 2001, now abandoned.

(30) Foreign Application Priority Data

Feb. 29, 2000 (JP) .......................................... 2000-53503
Feb. 29, 2000 (JP) .......................................... 2000-53504
Feb. 29, 2000 (JP) .......................................... 2000-53505

(51) Int. Cl.$^7$ .......................... C08G 8/28; C08G 14/04; G03F 7/023

(52) U.S. Cl. ...................... 525/491; 525/492; 528/155; 430/191; 430/192; 430/193

(58) Field of Search .......................... 525/491; 528/492, 528/155; 430/155, 191, 192, 193, 165

(56) References Cited

U.S. PATENT DOCUMENTS

| | | | |
|---|---|---|---|
| 4,837,121 A | 6/1989 | Blakeney et al. | |
| 5,130,410 A | 7/1992 | Zampini | |
| 5,196,289 A | 3/1993 | Jeffries, III et al. | |
| 5,234,795 A | 8/1993 | Jeffries, III et al. | |
| 5,413,894 A | 5/1995 | Sizensky et al. | |
| 5,604,077 A | 2/1997 | Kono et al. | |
| 6,642,345 B2 * | 11/2003 | Yuasa et al. ................. | 528/129 |

\* cited by examiner

*Primary Examiner*—John S. Chu
(74) *Attorney, Agent, or Firm*—Sughrue Mion, PLLC

(57) ABSTRACT

A phenol novolak resin has a peak intensity ratio of ortho-ortho bond (o-o)/ortho-para bond (o-p)/para-para bond (p-p) in a resin structure not substantially varying in each molecular weight fraction and has a weight average molecular weight (Mw) of 3000 to 20000 in terms of polystyrene, which peak intensity ratio is detected by $^{13}$C-NMR analysis. The phenol novolak resin can form both dense pattern and isolation pattern with good shapes in the formation of a fine resist pattern of not more than 0.35 μm and has satisfactory sensitivity, definition, and focal depth range properties, and has a resin composition being uniform in each molecular weight fraction. A process for producing the phenol novolak resin, and a positive photoresist composition using the resin are also provided.

1 Claim, No Drawings

PHENOL NOVOLAK RESIN, PRODUCTION PROCESS THEREOF, AND POSITIVE PHOTORESIST COMPOSITION USING THE SAME

This is a continuation of application Ser. No. 09/793,958 filed Feb. 28, 2001, now abandoned, the disclosure of which is incorporated herein by reference.

BACKGROUND OF THE INVENTION

1. Field of the Invention

The present invention relates to a phenol novolak resin which is useful as a film-forming component of a photosensitive composition, to a process for synthetically producing the resin, and to a positive photoresist composition using the resin.

2. Description of the Related Art

Phenol novolak resins obtained by condensation reaction of phenols such as cresol, xylenol, and trimethylphenol are generally used as film-forming components of positive photoresist compositions.

As a positive photoresist composition for use in i-line (365 nm) lithography, a positive photoresist composition including the phenol novolak resin and a 1,2-naphthoquinonediazide-group-containing compound is excellent in sensitivity, definition, and heat resistance and is widely practically used in the fields of the manufacture of semiconductor integrated circuits (ICs).

The density of such ICs becomes denser and denser with advance of semiconductor technologies, and particularly in the production of logic ICs, demands have been made on photoresist materials that can form a fine resist pattern of not more than 0.35 μm with a good shape both in a dense pattern or in an isolation pattern.

However, conventional positive photoresist compositions have strong tendency of reduction in film thickness and are believed not to form a fine pattern of not more than 0.35 μm with a good shape. Specifically, the pattern is tapered to thereby invite twist of pattern formation in an isolation pattern, and a separated pattern cannot be significantly formed or the film thickness is significantly reduced in a dense pattern.

A phenol novolak resin having a p-cresol constitutional unit or 3,4-xylenol constitutional unit is believed to be suitable for the preparation of a high definition positive photoresist composition. However, a positive photoresist composition using a phenol novolak resin containing p-cresol constitutional unit cannot provide satisfactory sensitivity compatible with high definition, and a positive photoresist composition using a phenol novolak resin containing 3,4-xylenol constitutional unit cannot form a satisfactory isolation pattern and the resulting isolation pattern is low in focal depth range properties, although the composition is excellent in sensitivity and definition.

Separately, demands have been made on means to produce IC chips at low cost with decreasing prices of IC chips, in order to make profits.

Especially, the production of highly integrated logic ICs including mixtures of dense patterns and isolation patterns of not more than 0.35 μm requires a large number of production steps and invites the cost to increase. To minimize the number of such production steps, demands are made on resist materials that can concurrently form such fine dense patterns and isolation patterns.

A variety of novolak resins containing xylenol constitutional unit or trimethylphenol constitutional unit have been proposed as such resist materials, but even these novolak resins cannot form dense patterns and isolation patterns with good shapes without deterioration in sensitivity and definition, in the formation of fine resist patterns of not more than 0.35 μm.

As thus described, in the formation where a definition of not more than 0.35 μm is required, the focal depth range properties are markedly deteriorated and resist patterns that can be used in practice cannot be formed. Therefore, demands are also made on materials that can form both dense patterns and isolation patterns with good shapes and have satisfactory focal depth range properties in the formation of fine resist patterns of not more than 0.35 μm.

Phenol novolak resins synthetically produced from two or more types of phenols are generally used in the positive photoresist composition. Individual phenols have, however, different reactivity. For example, p-cresol has a poor reactivity and most of p-cresol used as a starting material provides oligo-nuclear products.

Generally, part or overall of low-molecular-weight fractions having a molecular weight of not more than 2000, such as oligo-nuclear products of p-cresol, of phenol novolak resins used in the positive photoresist composition are removed by fractionation operation. Accordingly, if the amount of such oligo-nuclear products is large, the yield of the resulting phenol novolak resin is decreased and the production cost of the positive photoresist composition is increased.

Another type of phenol novolak resins is synthetically produced by using 3,5-xylenol, m-cresol, 3,4-xylenol, 2,5-xylenol, and other phenols having a high reactivity. This phenol novolak resin may have different resin composition [proportions of individual constitutional units or the ratio of ortho-ortho bond(o-o)/ortho-para bond (o-p)/para-para bond (p-p)] in high molecular weight fractions and in low molecular weight fractions of the resin, and the fractionation operation invites great variations in resin characteristics. The phenol novolak resin cannot therefore significantly provide a positive photoresist composition having stable characteristics.

Under these circumstances, demands have been made on a process for synthetically producing a phenol novolak resin that can inhibit the formation of oligo-nuclear products of phenols, where the resulting phenol novolak resin has no difference in resin composition both in high molecular weight fractions and low molecular weight fractions.

SUMMARY OF THE INVENTION

Accordingly, it is an object of the present invention to provide a positive photoresist composition that can form both a dense pattern and an isolation pattern with good shapes and has satisfactory sensitivity, definition, and focal depth range properties even in the formation of a fine resist pattern of not more than 0.35 μm.

Another object of the present invention is to provide a phenol novolak resin that is suitable for the preparation of the positive photoresist composition.

Yet another object of the present invention is to provide a phenol novolak resin which includes minimized oligo-nuclear products of phenols and has a uniform resin composition both in high molecular weight fractions and in low molecular weight fractions in the production of a phenol novolak resin using two or more types of phenols as materials, and a process for synthetically producing the phenol novolak resin.

After intensive investigations, the present inventors found that a phenol novolak resin having a specific structure and a positive photoresist composition prepared from the phenol novolak resin can achieve the above objects.

Specifically, the present invention provides, in an aspect, a phenol novolak resin (1) which has a peak intensity ratio of ortho-ortho bond (o-o)/ortho-para bond (o-p)/para-para bond (p-p) not substantially varying in each molecular weight fraction and which has a weight average molecular weight (Mw) in terms of polystyrene of 3000 to 20000, which peak intensity ratio is detected in a resin structure by $^{13}$C-NMR analysis.

The phenol novolak resin (1) may preferably include at least two selected from among phenol constitutional units represented by the following formulae (I) to (IV):

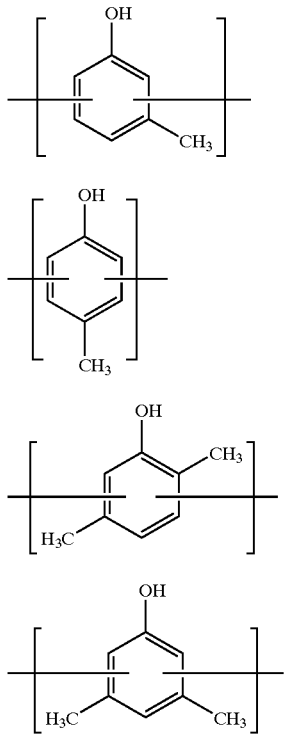

In another aspect, the present invention provides a phenol novolak resin (2) which has a peak intensity ratio of ortho-ortho bond (o-o)/ortho-para bond (o-p)/para-para bond (p-p) in a range of 3.0–5.0/2.0–3.5/1, which peak intensity ratio is detected in a resin structure by $^{13}$C-NMR analysis and does not substantially vary in each molecular weight fraction, and which includes phenol constitutional units represented by the formulae (I) and (III) and the following formula (V); and which has a weight average molecular weight (Mw) in terms of polystyrene of 3000 to 20000.

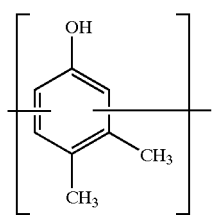

In the phenol novolak resins (1) and (2) just mentioned above, the ratio of the peak intensities of para-para bond (p-p) to the total of the peak intensities of ortho-ortho bond, ortho-para bond, and para-para bond [(o-o)+(o-p)+(p-p)] may preferably fall in a range of 10% to 20%.

The present invention provides, in a further aspect, a phenol novolak resin (3) which has a peak intensity ratio of ortho-ortho bond (o-o)/ortho-para bond (o-p)/para-para bond (p-p) in a range of 5.0–8.5/2.5–4.5/1 and which includes phenol constitutional units represented by the formulae (I) and (II) and the following formula (VI), which peak intensity ratio is detected in a resin structure by $^{13}$C-NMR analysis. This phenol novolak resin has a weight average molecular weight in terms of polystyrene of 3000 to 20000.

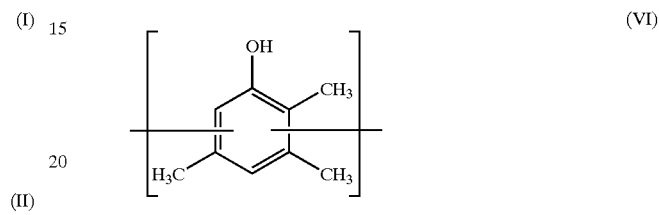

In the above-mentioned phenol novolak resin (3), the ratio of the peak intensities of para-para bond (p-p) to the total of the peak intensities of ortho-ortho bond, ortho-para bond, and para-para bond [(o-o)+(o-p)+(p-p)] may preferably fall in a range of 5% to 15%.

A resin film formed by the use of the phenol novolak resins (1) to (3) preferably dissolves in a 2.38% by weight aqueous tetramethylammonium hydroxide solution at 25° C. at a rate of 0.01 to 0.001 μm/s.

The present invention provides, in yet another aspect, a process for producing a phenol novolak resin which includes the steps of: (a) subjecting a phenol to a polycondensation reaction in the presence of an acid catalyst; (b) removing water from a reaction system; (c) decomposing, in the presence of an acid catalyst, the polycondensation product obtained in the step (a); and (d) subjecting the resulting product to a polycondensation reaction with an aldehyde or a ketone.

In addition and advantageously, the present invention provides a positive photoresist composition which includes the phenol novolak resins (1) to (3) and a 1,2-naphthoquinonediazide-group-containing compound.

DESCRIPTION OF THE PREFERRED EMBODIMENTS

[Phenol Novolak Resin]

Preferred phenol novolak resins (1) and (2) having a specific structure for use in the present invention have the ratio of peak intensities of o-o/o-p/p-p in a resin structure detected by $^{13}$C-NMR analysis not substantially varying in each molecular weight fraction and have a weight average molecular weight (Mw) of 3000 to 20000. The term "not substantially vary" as used herein means that the ratio of peak intensities varies within a range of, for example, ±30%, and preferably in a range of ±20%.

As the phenol novolak resin (1), those having at least two phenol constitutional units represented by the formulae (I) to (IV) in a resin structure are preferred. Phenol novolak resins having these constitutional units exhibit satisfactory characteristics such as sensitivity, definition, and focal depth range properties in the preparation of a positive photoresist composition.

Among them, a phenol novolak resin having the constitutional units (I), (II), and (III) [Resin 1], and a phenol novolak resin having the constitutional units (I), (III), and (IV) [Resin 2] are specifically preferred as a resin component of a positive photoresist composition.

Resin 1 preferably has a ratio of peak intensities of o-o/o-p/p-p in a range of 3.0–5.0/2.0–3.5/1, and further preferably has a ratio of peak intensity of p-p bond (p-p) to the total of peak intensities in a resin [(o-o)+(o-p)+(p-p)] in a range of 10% to 20%.

Resin 2 preferably has a ratio of peak intensities of o-o/o-p/p-p in a range of 4.0–5.0/1.5–2.5/1, and further preferably has a ratio of peak intensity of p-p bond (p-p) to the total of peak intensities in a resin [(o-o)+(o-p)+(p-p)] in a range of 10% to 20%.

Likewise, as the phenol novolak resin (2) having a specific structure for use in the invention, a preferred phenol novolak resin (Resin 3) has a peak intensity ratio of ortho-ortho bond (o-o)/ortho-para bond (o-p)/para-para bond (p-p) in a range of 3.0–5.0/2.0–3.5/1, which peak intensity ratio is detected in a resin structure by $^{13}$C-NMR analysis and does not substantially vary in each molecular weight fraction. This phenol novolak resin includes phenol constitutional units represented by the formulae (I), (III), and (V), and has a weight average molecular weight (Mw) in terms of polystyrene of 3000 to 20000.

Resin 3 preferably has a ratio of peak intensity of p-p bond (p-p) to the total of peak intensities in a resin [(o-o)+(o-p)+(p-p)] in a range of 10% to 20%.

As the phenol novolak resin (3) having a specific structure for use in the invention, a preferred phenol novolak resin (Resin 4) has a peak intensity ratio of ortho-ortho bond (o-o)/ortho-para bond (o-p)/para-para bond (p-p) in a range of 5.0–8.5/2.5–4.5/1, and preferably in a range of 6.0–7.5/3.0–4.0/1, the peak intensity ratio is detected in a resin structure by $^{13}$C-NMR analysis. This phenol novolak resin includes phenol constitutional units represented by the formulae (I), (III), and (VI), and has a weight average molecular weight (Mw) in terms of polystyrene of 3000 to 20000.

Resin 4 preferably has a ratio of peak intensity of p-p bond (p-p) to the total of peak intensities in a resin [(o-o)+(o-p)+(p-p)] in a range of 5% to 15%.

The term "o-o bond" used herein means an alkylene bond through which two phenol constitutional units are bound at the o-positions of hydroxyl groups of both phenol constitutional units. Likewise, the term "o-p bond" means an alkylene bond through which two phenol constitutional units are bound at the opposition of a hydroxyl group of one phenol constitutional unit and at the p-position of a hydroxyl group of the other phenol constitutional unit. The term "p-p bond" means an alkylene bond through which two phenol constitutional units are bound at the p-positions of hydroxyl groups of both phenol constitutional units.

Particularly, the phenol novolak resins of the present invention (Resins 1 to 4) preferably have a weight average molecular weight (Mw) in terms of polystyrene of about 4000 to 10000. Such phenol novolak resins can be advantageously used in the formation of a fine resist pattern of not more than 0.35 μm and can yield satisfactory sensitivity, definition, and focal depth range properties.

When a resin film of the phenol novolak resin having a Mw in the aforementioned range is formed, the film preferably dissolves in a 2.38% by weight aqueous tetramethylammonium hydroxide solution at 25° C. at a rate of 0.01 to 0.001 μm/s. This type of phenol novolak resin can yield a positive photoresist composition having an improved sensitivity without deterioration in definition.

In the present invention, the rate of dissolution as mentioned above is determined by dipping a silicon wafer having a resin film 1 μm thick in a 2.38% by weight aqueous tetramethylammonium hydroxide (TMAH) solution at 25° C. and determining the time (s) to reduce the film thickness to zero.

In this connection, even when the other resins than the phenol novolak resins of the invention are used, a resin composition having Mw of about 4000 to 10000 and a rate of dissolution of about 0.01 to 0.001 μm/s can be obtained by mixing a plurality of resins. However, such a mixed resin has cannot prepare a positive photoresist composition having stable characteristics. Additionally, the mixed resin exhibits a high film reduction rate and cannot form a fine resist pattern of not more than 0.35 μm with a good shape.

The phenol novolak resins of the invention can be synthetically produced by any process as far as the resulting resins satisfies the ratio of peak intensities and the weight average molecular weight (Mw) specified in the present invention. However, the following process is preferred, which can inhibit the formation of oligo-nuclear products of phenols and can efficiently synthetically produce the phenol novolak resin at low cost.

[Production Process of Phenol Novolak Resin]

The production process of a phenol novolak resin of the invention includes the following steps (a) to (d):

(a) subjecting a phenol to a polycondensation reaction in the presence of an acid catalyst;

(b) removing water from a reaction system;

(c) decomposing, in the presence of an acid catalyst, the polycondensation product obtained in the step (a); and (d) subjecting the resulting product to a polycondensation reaction with an aldehyde or a ketone.

[Step (a)]

Preferably, in the polycondensation reaction in the step (a), a phenol and an aldehyde or ketone are put into an organic solvent and a reaction is performed in the presence of an acid catalyst.

The overall or part of a phenol to be used for the production of the phenol novolak resin is added in this step.

In the latter, the residual phenol should be preferably added in the step (c) or in the step (d). Particularly preferably, the residual phenol should be added in the step (c) to enhance a decomposition reaction.

Typically preferably, the reaction is performed at a temperature of about 70° C. to 120° C. for about 3 to 20 hours.

As the phenols for use in the polycondensation reaction in the step (a), when synthesizing the phenol novolak resin (1), preferred are those containing at least one selected from among phenols corresponding to the repeating units represented by the formulae (I) to (IV), i.e., m-cresol, p-cresol, 2,5-xylenol, and 3,5-xylenol; when synthesizing the phenol novolak resin (2), those containing at least one selected from among phenols corresponding to the repeating units represented by the formulae (I), (III), and (V), i.e., m-cresol, 2,5-xylenol, and 3,4-xylenol; and, when synthesizing the phenol novolak resin (3), those containing at least one selected from among phenols corresponding to the repeating units represented by the formulae (I), (II), and (VI), i.e., m-cresol, p-cresol, and 2,3,5-trimethylphenol.

In addition to the specific phenols of preferred combinations, other phenols can be added. Such additional phenols include, but are not limited to, those conventionally used for the synthetic production of novolak resins for positive photoresist compositions. Such phenols include, for example, phenol, o-cresol, 2,3-xylenol, and other xylenols;

m-ethylphenol, p-ethylphenol, o-ethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenyl, and other aryl-substituted phenols; 4,4'-dihydroxybiphenyl, bisphenol A, resorcinol, hydroquinone, pyrogallol, and other polyhydroxyphenols. Each of these phenols can be used alone or in combination.

These additional phenols should be preferably used within a range of not more than 50% by mole relative to the total phenols for use in the production of the phenol novolak resin to avoid deterioration in the characteristics of the positive photoresist composition of the invention.

The polycondensation product synthetically produced in the step (a) has a weight average molecular weight (Mw) in terms of polystyrene of preferably 1000 to 20000, and more preferably 2500 to 10000. If Mw is less than 1000, the target phenol novolak resin cannot be significantly produced, and if it exceeds 20000, the step (c) takes much time.

Aldehydes and ketones for use in the polycondensation reaction in the step (a) include, but are not limited to, those conventionally used for the synthetic production of novolak resins for positive photoresist compositions.

Such aldehydes include, but are not limited to, formaldehyde, paraformaldehyde, trioxane, acetaldehyde, propionaldehyde, butyraldehyde, trimethylacetaldehyde, acrolein (acrylaldehyde), crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination.

The ketones include, for example, acetone, methyl ethyl ketone, diethyl ketone, and diphenyl ketone. Each of these ketones may be used alone or in combination. Further, an appropriate combination of an aldehyde and a ketone can be employed.

A phenol having a methylol group substituted on its nucleus can be used as the phenol. In this case, the aldehyde or ketone is not always required in the reaction.

Acid catalysts for use in the condensation reaction of the phenol with the aldehyde or ketone include, for example, hydrochloric acid, sulfuric acid, phosphoric acid, and other inorganic acids, oxalic acid, formic acid, acetic acid, p-toluenesulfonic acid, and other organic acids, of which oxalic acid is specifically preferred. The acid catalyst should be preferably added in a proportion of about 0.001% to 10% by weight relative to the phenols. Organic solvents for use in the reaction include, but are not limited to, methanol, ethanol, propanol, butanol, ethylene glycol, propylene glycol, and other alcohols; diethylene glycol dimethyl ether, propylene glycol monopropyl ether, 1,2-dimethoxyethane, 1,2-diethoxyethane, and other ethers; tetrahydrofuran, dioxane, and other cyclic ethers; acetone, methyl ethyl ketone, methyl isobutyl ketone, and other ketones; and γ-butyrolactone, and other cyclic esters, of which γ-butyrolactone is specifically preferred. The amount of the organic solvent is preferably about 50% to 1000% by weight relative to the phenols to yield appropriate cost and reaction rate.

[Step (b)]

In the step (b), by-produced water, unreacted aldehyde and/or ketone are removed from a reaction system. By removing these substances from the reaction system, a decomposition reaction in the subsequent step (c) can be efficiently performed.

The removal of these substances is generally performed by, but is not limited to, heating under reduced pressure.

In this step, it is preferred to avoid the proceeding of a polycondensation reaction by action of the unreacted aldehyde or ketone, and therefore a heating temperature should be preferably low.

The removal is preferably performed until water and other substances to be removed are completely removed from the reaction system.

[Step (c)]

In the step (c), the polycondensation product produced in the step (a) is decomposed by action of an acid catalyst.

The decomposition reaction should be preferably performed until the resulting decomposed product has a weight average molecular weight (Mw) in terms of polystyrene of about 200 to 2000, and specifically about 500 to 1500. If Mw is out of the above range, the target phenol novolak resin cannot be significantly synthetically produced in the subsequent step (d).

The acid catalyst for use in this step may be one remaining in the reaction system after the step (b), or one newly added to the reaction system. As such a newly added acid catalyst, p-toluenesulfonic acid is preferred. The additional acid catalyst may be added such that the total amount of acid catalysts in the reaction system is preferably 0.01% to 20% by weight, and more preferably 1.0% to 10% by weight relative to the phenols.

Typically preferably, the reaction is performed at a temperature of about 80° C. to 150° C. for about 10 to 80 hours.

The decomposition reaction of the polycondensation product in the step (c) swiftly proceeds in the presence of a phenol, and is preferably performed in the presence of such a phenol.

The phenol may be one remaining in the reaction system as an unreacted monomer after the step (b) or one newly added to the reaction system. When the phenol is newly added, it must be selected from among phenols corresponding to constitutional units of the target phenol novolak resin.

[Step (d)]

In the step (d), the polycondensation product decomposed in the step (c) is subjected to a polycondensation reaction with an aldehyde or ketone to thereby yield a high molecular weight product.

The polycondensation product synthetically produced in the step (d) should preferably have a weight average molecular weight (Mw) in terms of polystyrene of 2000 to 20000, and more preferably 4000 to 10000. If Mw is less than 2000, film forming property and heat resistance may be deteriorated, and if it exceeds 20000, a highly sensitive positive photoresist composition cannot be significantly prepared.

Aldehydes and ketones for use in this step are not specifically limited, and those mentioned above can be used.

The acid catalyst used in the step (c) remains in the reaction system, and an additional acid catalyst is not required in the step (d). However, an additional acid catalyst can be added if desired.

Likewise, the organic solvent used in the reaction in the step (a) remains in the reaction system, and an additional organic solvent is not required in the step (d), but it can be added if desired.

Typically preferably, the reaction is performed at a temperature of about 70° C. to 120° C. for about 3 to 20 hours.

After the step (d), low molecular weight fractions of the resulting polycondensation product are removed by a conventional fractionation technique to thereby yield a phenol novolak resin having a weight average molecular weight (Mw) in terms of polystyrene of about 3000 to 20000. The phenol novolak resin should preferably have Mw of about 4000 to 10000 for use in positive photoresist compositions, and a desired Mw can be obtained by conventionally known fractionation operations of high molecular weight fractions and low molecular weight fractions. For example, the following technique is advantageous.

A solution of the novolak resin synthetically produced is dissolved in methyl amyl ketone (MAK) or a MAK-methanol mixture solvent, and the resulting solution is washed with water to remove the catalyst and unreacted compounds. To the residual is added a poor solvent such as hexane or heptane, or a hexane-MAK or heptane-MAK mixture, and the resultant mixture is stirred and is then allowed to stand to separate a MAK layer containing high molecular weight fractions as a lower layer, and a poor solvent layer containing low molecular weight fractions as an upper layer. The lower layer is extracted to thereby yield a phenol novolak resin having a high molecular weight (Mw=3000 to 20000).

The phenol novolak resin obtained after the step (d) is low in content of oligo-nuclear products of phenols which have low reactivity, and the yield of the phenol novolak resin is high to thereby reduce production cost.

The resulting phenol novolak resins (1) and (2) (specifically, Resins 1, 2, and 3) have a ratio of peak intensities of o-o/o-p/p-p in a resin structure detected by $^{13}$C-NMR analysis which does not substantially vary in any molecular weight fraction and is constant. Specifically, the resulting phenol novolak resins (1) and (2) have a resin composition not different in high molecular weight fractions and in low molecular weight fractions, in which the contents of o-o and o-p bonds relative to p-p bond are high.

This can be verified by, for example, repeating the fractionation operation and comparing the ratio of peak intensities of o-o/o-p/p-p of the phenol novolak resin after the fractionation with that before the fractionation.

Peaks in the vicinity of 24.8 to 32.5 ppm, in the vicinity of 32.6 to 35.5 ppm, and in the vicinity of 35.6 to 39.0 ppm are respectively assigned to the peaks of o-o bond, of o-p bond, and of p-p bond.

[Positive Photoresist Composition]

A positive photoresist composition of the present invention includes the phenol novolak resin and a 1,2-naphthoquinonediazide-group-containing compound.

[1,2-Naphthoquinonediazide-group-containing Compound]

Such 1,2-naphthoquinonediazide-group-containing compounds for use in the present invention are not specifically limited and include those conventionally used as photosensitive components of positive photoresist compositions for i-line lithography. Preferred 1,2-naphthoquinonediazide-group-containing compounds are esters of a hydroxy compound with a naphthoquinone-1,2-diazidesulfonyl halide such as naphthoquinone-1,2-diazide-5-sulfonyl chloride, naphthoquinone-1,2-diazide-4-sulfonyl chloride, and naphthoquinone-1,2-diazide-6-sulfonyl chloride.

Such hydroxy compounds for use in the above embodiment include, but are not limited to, the following compounds (i) to (iii):

(i) 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone, and other polyhydroxybenzophenones;

(ii) hydroxy-substituted aryls represented by the following formula (VII):

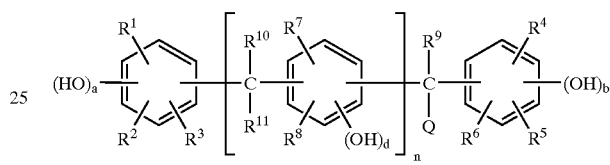

(VII)

wherein each of $R^1$ to $R^8$ is independently a hydrogen atom, a halogen atom, an alkyl group having 1 to 6 carbon atoms, an alkoxyl group having 1 to 6 carbon atoms, or a cycloalkyl group; each of $R^9$ to $R^{11}$ is independently a hydrogen atom or an alkyl group having 1 to 6 carbon atoms; Q is a hydrogen atom, an alkyl group having 1 to 6 carbon atoms, or Q is combined with $R^9$ to form a cyclic ring having 3 to 6 carbon members, or a residue represented by the following formula (VIII); a and b each denote an integer of 1 to 3; d denotes an integer of 0 to 3; and n denotes an integer of 0 to 3:

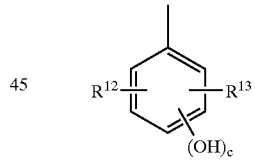

(VIII)

wherein each of $R^{12}$ and $R^{13}$ is independently a hydrogen atom, a halogen atom, an alkyl group having 1 to 6 carbon atoms, an alkoxyl group having 1 to 6 carbon atoms, or a cycloalkyl group; and c denotes an integer of 1 to 3; and (iii) phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified or partially etherified gallic acid, and other phenols.

In the above embodiment, the ester can be prepared by subjecting, for example, the naphthoquinone-1,2-diazidesulfonyl halide and the hydroxy compound to a condensation reaction to completely or partially esterify these compounds. The condensation reaction is advantageously performed in an organic solvent in the presence of a basic condensing agent. Such organic solvents include, for example, dioxane, N-methylpyrrolidone, and dimethylacetamide; and such basic condensing agents include, for example, triethylamine, triethanolamine, an alkali carbonate, and an alkali hydrogencarbonate. The resulting ester should be preferably obtained by condensing 50% by mole or more, preferably 60% by more of, for example, a naphthoquinone-1,2-diazide-4(or -5)-sulfonyl halide relative to the total mole of hydroxyl groups in the hydroxy compound (i.e., the rate of esterification is 50% or more, and preferably 60% or more). The positive photoresist composition using such esters can yield higher definition.

As described in Japanese Patent Laid-Open No. 9-43841, part of hydroxyl groups of the hydroxy compound may be esterified with a sulfonyl halide other than the naphthoquinonediazidesulfonyl halides. Specifically, esters of a compound represented by the following formula (IX) and a naphthoquinonediazidesulfonyl halide with a hydroxy compound can be advantageously used:

$$R^{14}—SO_2—X \qquad (IX)$$

wherein $R^{14}$ is an alkyl group, an alkyl group having at least one substituent, an alkenyl group, an aryl group, or an aryl group having at least one substituent; and X is a halogen atom. Such compounds represented by the formula (IX) include, but are not limited to, methanesulfonyl chloride, methanesulfonyl fluoride, ethanesulfonyl chloride, n-propanesulfonyl chloride, n-butanesulfonyl chloride, pentanesulfonyl chloride, dodecanesulfonyl chloride, and other alkane-sulfonyl halides each having 1 to 12 carbon atoms; chloromethylsulfonyl chloride, dichloromethylsulfonyl chloride, trichloromethylsulfonyl chloride, 2-chloroethylsulfonyl chloride, and other substituted alkanesulfonyl halides each having 1 to 12 carbon atoms; ethylenesulfonyl chloride, 1-propene-1-sulfonyl chloride, and other alkene-sulfonyl halides each having 2 or 3 carbon atoms; benzenesulfonyl chloride, benzenesulfonyl fluoride, benzylsulfonyl chloride, 1-naphthalenesulfonyl chloride, and other aryl-sulfonyl halides; p-toluenesulfonyl chloride, p-ethylbenzenesulfonyl chloride, p-styrenesulfonyl chloride, p-methoxybenzenesulfonyl chloride, and other alkyl-, alkenyl-, or alkoxy-substituted aryl-sulfonyl halides. Esters of these compounds and the naphthoquinonediazidesulfonyl halide with the hydroxy compound can be used.

Of these esters, naphthoquinone-1,2-diazidesulfonyl esters of bis(3-cyclohexyl-4-hydroxy-6-methylphenyl)-3,4-dihydoxyphenylmethane, 1-[1-(4-hydroxyphenyl) isopropyl]-4-[1,1-bis (4-hydroxyphenyl)ethyl]benzene, or bis[2,5-dimethyl-3-(2-hydroxy-5-methylbenzyl)-4-hydroxyphenyl]methane are preferred.

The amount of the 1,2-naphthoquinonediazide-group-containing compound should preferably fall in a range of 10% to 60% by weight, and more preferably in a range of 20% to 50% by weight relative to the total weight of the phenol novolak resin and the following sensitizer added according to necessity. If the amount exceeds 60% by weight, the sensitivity may be deteriorated, and if it is less than 10% by weight, an image in exact accordance with a pattern cannot be obtained due to film reduction in unexposed portions or deterioration in definition.

The positive photoresist composition of the invention may further comprise a sensitizer (an intensifier) according to necessity within a range not deteriorating the preferable performances of the composition.

[Sensitizer (Intensifier)]

Sensitizers (intensifiers) for use in the invention include, but are not limited to, compounds conventionally used as sensitizers (intensifiers) of positive photoresist compositions. Such compounds include, for example, the compounds represented by the formula (VII), such as bis(4-hydroxy-2,3,5-trimethylphenyl)-2-hydroxyphenylmethane, 1,4-bis[1-(3,5-dimethyl-4-hydroxyphenyl)isopropyl] benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl) ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 2,6-bis (3,5-dimethyl-4-hydroxybenzyl)-4-methylphenol, and 1,1-bis(4-hydroxyphenyl) cyclohexane. Additionally, 6-hydroxy-4a-(2,4-dihydroxyphenyl)-9-1'-spirocyclohexyl-1,2,3,4,4a,9a-hexahydroxanthene, and 6-hydroxy-5-methyl-4a-(2,4-dihydroxy-3-methylphenyl)-9-1'-spirocyclohexyl-1,2,3,4,4a,9a-hexahydroxanthene can be used.

Among them, 1,1-bis(4-hydroxyphenol)cyclohexane, bis (4-hydroxy-3,5-dimethylphenyl)-3,4-dihydroxyphenylmethane, 2,6-bis(3,5-dimethyl-4-hydroxybenzyl)-4-methylphenol, and 1-[1-(4-hydroxyphenyl)isopropyl]-4-[1,1-bis(4-hydroxyphenyl) ethyl]benzene are preferred.

When the sensitizer (intensifier) is incorporated, the amount of the sensitizer is selected within a range of 5% to 50% by weight, and preferably 10% to 35% by weight, relative to the phenol novolak resin.

[Other Ingredients]

According to the present invention, the positive photoresist composition may further comprise various additives to further improve definition, exposure margin, and film residual rate. Such additives include, for example, p-toluenesulfonyl chloride (PTSC), 4,4'-bis (diethylamino) benzophenone, 1,4-bis[1-(2-methyl-4-hydroxy-5-cyclohexylphenyl)isopropyl]benzene, and 1,3-bis[1-(2-methyl-4-hydroxy-5-cyclohexylphenyl)isopropyl]benzene. Each of these additives can be added in a proportion of about 0.01% to 10% by weight relative to the positive photoresist composition.

In addition to the above specified ingredients, where necessary, the positive photoresist composition of the present invention may further comprise any of compatible additives including, for example, ultraviolet absorbents for inhibition of halation and surfactants for prevention of striation within ranges not adversely affecting the objects of the invention. Such ultraviolet absorbents include, for example, 4-dimethylamino-2',4'-dihydroxybenzophenone, 5-amino-3-methyl-1-phenyl-4-(4-hydroxyphenylazo) pyrazole, 4-dimethylamino-4'-hydroxyazobenzene, 4-diethylamino-4'-ethoxyazobenzene, 4,4'-diethylaminoazobenzene, and curcumin. The surfactants include, but are not limited to, Fluorade FC-430 and FC-431 (trade names, manufactured by Sumitomo 3M Ltd., Japan), F-TOP EF122A, EF122B, EF122C, and EF126 (trade names, manufactured by Tochem Products Ltd., Japan) and other fluorine-containing surfactants.

The positive photoresist composition of the invention is preferably used as a solution obtained by dissolving each of the above-specified ingredients in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers or monophenyl ethers thereof, and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. Of these solvents, typically preferred are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

Practically, the positive photoresist composition of the present invention may be preferably used, for example, in the following manner. Each of the phenol novolak resin and the 1,2-naphthoquinonediazide-group-containing compound, and other ingredients added according to necessity is dissolved in an appropriate solvent as mentioned above to yield a coating solution; the coating solution is then applied, using a spinner or the like, onto a substrate such as a silicon wafer or a substrate on which an antireflection coating has been formed, and is then dried to form a photosensitive layer; next, the photosensitive layer is irradiated and is exposed with an ultraviolet ray source such as a low-pressure mercury lamp, a high-pressure mercury lamp, an ultra-high-pressure mercury lamp, an arc lamp, or a xenon lamp, through a desired mask pattern, or irradiated with a scanning electron beam; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

The present invention will be further illustrated in detail with reference to several invented examples and comparative examples below which are not intended to limit the scope of the invention.

EXAMPLES

Preparation Example 1

[Preparation of a Phenol Novolak Resin (A1) Comprising m-cresol/p-cresol/2,5-xylenol=60/20/20 (by mole)]

To 150 g of γ-butyrolactone, 64.8 g of m-cresol, 21.6 g of p-cresol, 24.4 g of 2,5-xylenol, and 1.0 g of oxalic acid were added, and 60.8 g of an aqueous 37% formaldehyde solution was added dropwise to the mixture at 100° C. over a half hour.

After the completion of addition, the resulting mixture was stirred for 15 hours to thereby yield a polycondensation product having Mw of 2900 in a reaction system.

Next, about 50 g of unreacted formaldehyde, water and other unnecessary substances were removed at 70° C. at a reduced pressure of 100 Pa, and 2.0 g of p-toluenesulfonic acid was added and the resulting mixture was stirred at 110° C. for 20 hours. As a result, the polycondensation product in the reaction system had a reduced Mw of 1500.

To the reaction mixture, 10.0 g of an aqueous 37% formaldehyde solution was added and was allowed to react at 90° C. for 10 hours to thereby yield a polycondensation product having Mw of 5390 [polycondensation product (a1)] in the reaction system.

(Fractionation Operation)

50% by weight of water relative to the reation solution was added to the reaction solution and the mixture was allowed to stand for one hour to separate into two phases. The upper phase was decanted to thereby yield a phenol novolak resin solution.

The solution was dissolved in 500 g of methyl amyl ketone (MAK), and was washed with water to remove the acid catalyst, unreacted materials, and low molecular weight substances.

The resulting product was adjusted to 600 g of a 15% by weight solution in MAR, and to this solution, 585 g of n-heptane was added, and the mixture was stirred, was allowed to stand, and the lower phase (MAK phase) was extracted to thereby yield a phenol novolak resin (A1) having Mw of 8440 and a rate of dissolution of 0.003 μm/s. The yield calculated from the amount of material phenols was 53%.

Preparation Example 2

[Preparation of Phenol Novolak Resin (B1) Comprising m-cresol/2,5-xylenol/3,5-xylenol=60/20/20 (by mole)]

To 150 g of γ-butyrolactone, 21.6 g of m-cresol, 24.4 g of 2,5-xylenol, and 1.0 g of oxalic acid were added, and 55.1 g of an aqueous 37% formaldehyde solution was added dropwise to the mixture at 100° C. over a half hour.

After the completion of addition, the resulting mixture was stirred for 15 hours to thereby yield a polycondensation product having Mw of 2590 in a reaction system.

Next, about 45 g of unreacted formaldehyde, water and other unnecessary substances were removed at 70° C. at a reduced pressure of 100 Pa, and 2.0 g of p-toluenesulfonic acid and 24.4 g of 3,5-xylenol were added and the resulting mixture was stirred at 110° C. for 15 hours. As a result, the polycondensation product in the reaction system had a reduced Mw of 1100.

To the reaction mixture, 18 g of an aqueous 37% formaldehyde solution was added and was allowed to react at 90° C. for 10 hours to thereby yield a polycondensation product having Mw of 5010 [polycondensation product (b1)] in the reaction system.

(Fractionation Operation)

The fractionation operation of Preparation Example 1 was repeated to thereby yield a phenol novolak resin (B1) having Mw of 8880 and a rate of dissolution of 0.002 μm/s. The yield calculated from the amount of material phenols was 63%.

Preparation Example 3

[Preparation of Phenol Novolak Resin (C1) Comprising o-cresol/3,5-xylenol=90/10 (by mole)]

To 150 g of γ-butyrolactone, 97.2 g of o-cresol and 1.0 g of p-toluenesulfonic acid were added, and 73.0 g of an aqueous 37% formaldehyde solution was added dropwise to the mixture at 100° C. over a half hour.

After the completion of addition, the resulting mixture was stirred for 15 hours to thereby yield a polycondensation product having Mw of 2410 in a reaction system.

Next, about 60 g of unreacted formaldehyde, water and other unnecessary substances were removed at 70° C. at a reduced pressure of 100 Pa, and 1.0 g of p-toluenesulfonic acid and 12.2 g of 3,5-xylenol were added and the resulting mixture was stirred at 110° C. for 20 hours. As a result, the polycondensation product in the reaction system had a reduced Mw of 2150.

To the reaction mixture, 10 g of an aqueous 37% formaldehyde solution was added and the mixture was allowed to react at 90° C. for 10 hours to thereby yield a polycondensation product having Mw of 2680 [polycondensation product (c1)] in the reaction system.

(Fractionation Operation)

The fractionation operation of Preparation Example 1 was repeated to thereby yield a phenol novolak resin (C1) having Mw of 5080 and a rate of dissolution of 0.01 μm/s. The yield calculated from the amount of material phenols was 55%.

Preparation Example 4

[Preparation of Phenol Novolak resin (D1) Comprising m-cresol/3,4-xylenol/2,5-xylenol=70/10/20 (by mole)]

To 150 g of γ-butyrolactone, 75.6 g of m-cresol, 24.4 g of 2,5-xylenol, and 1.0 g of oxalic acid were added, and 65.7 g of an aqueous 37% formaldehyde solution was added dropwise to the mixture at 100° C. over a half hour.

After the completion of addition, the resulting mixture was stirred for 15 hours to thereby yield a polycondensation product having a weight average molecular weight (Mw) in terms of polystyrene of 6860 in a reaction system.

Next, about 60 g of unreacted formaldehyde, water and other unnecessary substances were removed at 70° C. at a reduced pressure of 100 Pa, and 12.2 g of 3,4-xylenol and 2.0 g of p-toluenesulfonic acid were added and the resulting mixture was stirred at 110° C. for 40 hours. As a result, the polycondensation product in the reaction system had a reduced Mw of 1050.

To the reaction mixture, 15.0 g of an aqueous 37% formaldehyde solution was added and was allowed to react at 90° C. for 10 hours to thereby yield a polycondensation product having Mw of 5050 [polycondensation product (d1)] in the reaction system.

(Fractionation Operation)

50% by weight of water relative to the reation solution was added to the reaction solution and the mixture was allowed to stand for one hour to separate into two phases. The upper phase was decanted to thereby yield a phenol novolak resin solution.

The solution was dissolved in 500 g of methyl amyl ketone (MAK), and was washed with water to remove the acid catalyst, unreacted materials, and low molecular weight substances.

The resulting product was adjusted to 600 g of a 15% by weight solution in MAK, and to this solution, 630 g of n-heptane was added, and the mixture was stirred, was allowed to stand, and the lower phase (MAK phase) was extracted to thereby yield a phenol novolak resin (D1) having Mw of 8660 and a rate of dissolution of 0.004 μm/s.

Preparation Example 5

[Preparation of Phenol Novolak Resin (E1) Comprising m-cresol/p-cresol/2,3,5-trimethylphenol=70/20/10 (by mole)]

To 150 g of γ-butyrolactone, 75.6 g of m-cresol, 21.6 g of p-cresol, and 1.0 g of p-toluenesulfonic acid were added, and 54.7 g of an aqueous 37% formaldehyde solution was added dropwise to the mixture at 100° C. over a half hour.

After the completion of addition, the resulting mixture was stirred for 10 hours to thereby yield a polycondensation product having a weight average molecular weight (Mw) in terms of polystyrene of 4470 in a reaction system.

Next, about 45 g of unreacted formaldehyde, water and other unnecessary substances were removed at 70° C. at a reduced pressure of 100 Pa, and 1.0 g of p-toluenesulfonic acid and 13.6 g of 2,3,5-trimethylphenol were added and the resulting mixture was stirred at 110° C. for 15 hours. As a result, the polycondensation product in the reaction system had a reduced Mw of 920.

To the reaction mixture, 15.0 g of an aqueous 37% formaldehyde solution was added and was allowed to react at 90° C. for 10 hours to thereby yield a polycondensation product having Mw of 3740 [polycondensation product (e1)] in the reaction system.

(Fractionation Operation)

The fractionation operation of Preparation Example 4 was repeated to thereby yield a phenol novolak resin (E1) having Mw of 5510 and a rate of dissolution of 0.008 μm/s.

Each of the above prepared phenol novolak resins A1 to D1 was dissolved in MAK to yield 600 g of a 15% by weight solution in MAK, and 630 g of n-heptane was added to the solution, and the mixture was stirred, was allowed to stand, and the resulting lower phase (MAK phase) was extracted to yield resins A1' to D1'.

The polycondensation products a1 to e1, phenol novolak resins A1 to E1, and resins A1' to D1' were subjected to $^{13}$C-NMR analysis, and the results are shown in Table 1.

TABLE 1

| | o-o/o-p/p-p (peak intensity ratio) before fractionation after first fractionation after second fractionation | (p-p) Ratio of resin after fractionation (%) | Mw (1)before fractionation (2)after first fractionation (3)after second fractionation | Dissolution rate of resin after fractionation (μm/s) |
|---|---|---|---|---|
| PRE. EX. 1 | (a1) 3.5/2.6/1.0 (A1) 3.3/2.4/1.0 (A1') 3.4/2.7/1.0 | 15 14 | (1) 5390 (2) 8440 (3) 14300 | 0.003 <0.001 |
| PRE. EX. 2 | (b1) 4.7/2.0/1.0 (B1) 4.6/2.1/1.0 (B1') 4.4/2.3/1.0 | 13 13 | (1) 5010 (2) 8880 (3) 12700 | 0.002 <0.001 |
| PRE. EX. 3 | (c1) 1.0/2.2/1.0 (C1) 1.1/2.4/1.0 (C1') 1.1/2.4/1.0 | 22 22 | (1) 2680 (2) 5080 (3) 8320 | 0.01 0.003 |
| PRE. EX. 4 | (d1) 3.5/2.1/1.0 (D1) 3.8/2.2/1.0 (D1') 3.9/2.2/1.0 | 14 14 | (1) 5050 (2) 8660 (3) 13300 | 0.004 0.001 |
| PRE. EX. 5 | (e1) 7.8/3.6/1.0 (E1) 5.7/3.3/1.0 | 10 | (1) 3740 (2) 5510 | 0.008 |

Table 1 show that the phenol novolak resins prepared according to the processes described in Preparation Examples 1 to 4 each had a ratio of peak intensities of ortho-ortho bond/ortho-para bond/para-para bond not substantially varying each molecular weight fraction in the resin structure detected by $^{13}$C-NMR analysis.

Comparative Preparation Example 1

[Preparation of Phenol Novolak Resin (A2) Comprising m-cresol/p-cresol/2,5-xylenol=60/20/20 (by mole)]

To 150 g of γ-butyrolactone, 64.8 g of m-cresol, 21.6 g of p-cresol, 24.4 g of 2,5-xylenol, and 1.0 g of oxalic acid were added, and 63.5 g of an aqueous 37% formaldehyde solution was then added dropwise to the mixture at 100° C. over a half hour.

After the completion of addition, the mixture was stirred for 15 hours to yield a polycondensation product (a2) having Mw of 5240 in a reaction system.

(Fractionation Operation)

The fractionation operation of Preparation Example 1 was repeated to thereby yield a phenol novolak resin (A2) having Mw of 11200 and a rate of dissolution of 0.002 m/s. The yield calculated from the amount of material phenols was 28%.

Comparative Preparation Example 2

[Preparation of Phenol Novolak Resin (B2) Comprising m-cresol/2,5-xylenol/3,5-xylenol=60/20/20 (by mole)]

To 150 g of γ-butyrolactone, 64.8 g of m-cresol, 24.4 g of 2,5-xylenol, 24.4 g of 3,5-xylenol, and 1.0 g of oxalic acid were added, and 68.9 g of an aqueous 37% formaldehyde solution was then added dropwise to the mixture at 100° C. over a half hour.

After the completion of addition, the mixture was stirred for 15 hours to yield a polycondensation product (b2) having Mw of 4970 in a reaction system.

(Fractionation Operation)

The fractionation operation of Preparation Example 1 was repeated to thereby yield a phenol novolak resin (B2) having Mw of 9990 and a rate of dissolution of 0.001 μm/s. The yield calculated from the amount of material phenols was 42%.

Comparative Preparation Example 3

[Preparation of Phenol Novolak Resin (C2) Comprising o-cresol/3,5-xylenol=90/10 (by mole)]

To 150 g of γ-butyrolactone, 97.2 g of o-cresol, 12.2 g of 3,5-xylenol, and 1.0 g of oxalic acid were added, and 73.0 g of an aqueous 37% formaldehyde solution was then added dropwise to the mixture at 100° C. over a half hour.

After the completion of addition, the mixture was stirred for 15 hours to yield a polycondensation product (c2) having Mw of 2690 in a reaction system.

(Fractionation Operation)

The fractionation operation of Preparation Example 1 was repeated to thereby yield a phenol novolak resin (C2) having Mw of 5600 and a rate of dissolution of 0.01 μm/s. The yield calculated from the amount of material phenols was 37%.

Comparative Preparation Example 4

[Preparation of Phenol Novolak Resin (D2) Comprising m-cresol/3,4-xylenol/2,5-xylenol=70/10/20 (by mole)]

To 150 g of γ-butyrolactone, 75.6 g of m-cresol, 12.2 g of 3,4-xylenol, 24.4 g of 2,5-xylenol, and 1.0 g of oxalic acid were added, and 70.9 g of an aqueous 37% formaldehyde solution was then added dropwise to the mixture at 100° C. over a half hour.

After the completion of addition, the mixture was stirred for 15 hours to yield a polycondensation product (d2) having Mw of 3970 in a reaction system.

(Fractionation Operation)

The fractionation operation of Preparation Example 4 was repeated to thereby yield a phenol novolak resin (D2) having Mw of 7440 and a rate of dissolution of 0.004 μm/s.

Comparative Preparation Example 5

[Preparation of Phenol Novolak Resin (E2) Comprising m-cresol/p-cresol/2,3,5-trimethylphenol=70/20/10 (by mole)]

To 150 g of γ-butyrolactone, 75.6 g of m-cresol, 21.6 g of p-cresol, 13.6 g of 2,3,5-trimethylphenol, and 1.0 g of p-toluenesulfonic acid were added, and 64.9 g of an aqueous 37% formaldehyde solution was then added dropwise to the mixture at 100° C. over a half hour.

After the completion of addition, the mixture was stirred for 15 hours to yield a polycondensation product (e2) having Mw of 4420 in a reaction system.

(Fractionation Operation)

The fractionation operation of Preparation Example 4 was repeated to thereby yield a phenol novolak resin (E2) having Mw of 7530 and a rate of dissolution of 0.008 μm/s The polycondensation products a2 to e2 and the phenol novolak resins A2 to E2 were subjected to $^{13}$C-NMR analysis and the results are shown in Table 2.

TABLE 2

| | o-o/o-p/p-p (peak intensity ratio) before fractionation after fractionation | (p-p) Ratio of resin after fractionation (%) | Mw (1) before fractionation (2) after fractionation | Dissolution rate of resin after fractionation (μm/s) |
|---|---|---|---|---|
| COM. PRE. EX. 1 | (a2) 1.4/1.2/1.0<br>(A2) 2.0/1.4/1.0 | 23 | (1) 5240<br>(2) 11200 | 0.002 |
| COM. PRE. EX. 2 | (b2) 5.2/1.5/1.0<br>(B2) 6.7/2.3/1.0 | 10 | (1) 4970<br>(2) 9990 | 0.001 |
| COM. PRE. EX. 3 | (c2) 1.3/1.7/1.0<br>(C2) 2.0/2.0/1.0 | 20 | (1) 2690<br>(2) 5600 | 0.01 |
| COM. PRE. EX. 4 | (d2) 2.8/1.4/1.0<br>(D2) 2.7/1.6/1.0 | 19 | (1) 3970<br>(2) 7440 | 0.004 |
| COM. PRE. EX. 5 | (e2) 4.5/2.3/1.0<br>(E2) 4.0/1.9/1.0 | 14 | (1) 4420<br>(2) 7530 | 0.008 |

Table 2 shows that the phenol novolak resins prepared according to processes described in Comparative Preparation Examples 1 to 5 (other than 4) had a ratio of peak intensities of ortho-ortho bond/ortho-para bond/para-para bond significantly varying in each molecular weight fraction in the resin structure detected by $^{13}$C-NMR analysis.

Example 1

Coating composition 1 of a positive photoresist composition was prepared by mixing 100 parts by weight of the phenol novolak resin (A1) prepared in Preparation Example 1, 35 parts by weight of a 1,2-naphthoquinonediazide-group-containing compound, 28 parts by weight of a sensitizer, and 420 parts by weight of a solvent. The ingredients are as follows.

Phenol novolak resin: (A1)

1,2-Naphthoquinonediazide-group-containing compound: a mixture of an ester (a) of 1 mole of bis[2,5-dimethyl-3-(2-hydroxy-5-methylbenzyl)-4-hydroxyphenyl] methane with 2.5 moles of naphthoquinone-1,2-diazide-5-sulfonyl chloride, and an ester (b) of 1 mole of-1-[1-(4-hydroxyphenyl)isopropyl]-4-[1,1-bis(4-hydroxyphenyl) ethyl]benzene with 3 moles of naphthoquinone-1,2-diazide-5-sulfonyl chloride [(a)/(b)=8/2 (by weight)]

Sensitizer: 1-[1-(4-hydroxyphenyl)isopropyl]-4-[1,1-bis (4-hydroxyphenyl)ethyl]benzene Solvent: methyl amyl ketone (MAK)

Example 2

Coating composition 2 of a positive photoresist composition was prepared in the same manner as in Example 1, except that the phenol novolak resin (B1) prepared in Preparation Example 2 was used instead of the phenol novolak resin (A1).

Example 3

Coating composition 3 of a positive photoresist composition was prepared in the same manner as in Example 1, except that the phenol novolak resin (D1) prepared in Preparation Example 4 was used instead of the phenol novolak resin (A1).

Example 4

Coating composition 4 of a positive photoresist composition was prepared in the same manner as in Example 1, except that the phenol novolak resin (E1) prepared in Preparation Example 5 was used instead of the phenol novolak resin (A1).

Example 5

Coating composition 5 of a positive photoresist composition was prepared in the same manner as in Example 1, except that the phenol novolak resin (D2) prepared in Comparative Preparation Example 4 was used instead of the phenol novolak resin (A1).

Comparative Example 1

Coating composition 6 of a positive photoresist composition was prepared in the same manner as in Example 1, except that the phenol novolak resin (A2) prepared in Comparative Preparation Example 1 was used instead of the phenol novolak resin (A1).

Comparative Example 2

Coating composition 7 of a positive photoresist composition was prepared in the same manner as in Example 1, except that the phenol novolak resin (B2) prepared in Comparative Preparation Example 2 was used instead of the phenol novolak resin (A1).

Comparative Example 3

Coating composition 8 of a positive photoresist composition was prepared in the same manner as in Example 1, except that the phenol novolak resin (E2) prepared in Comparative Preparation Example 5 was used instead of the phenol novolak resin (A1).

The above-prepared coating compositions 1 to 8 were subjected to the following evaluations. The results are shown in Table 3, and the results on dimensional evaluation are shown in Table 4.

[Sensitivity Evaluation]

A sample was applied onto a silicon wafer using a spinner, and was dried on a hot plate at 90° C. for 90 sec. to form a resist film having a thickness of 1.25 $\mu$m. The resist film was then irradiated through a mask for an increasing period from 0.1 sec. at intervals of 0.01 sec. using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide aqueous solution at 23° C. for 60 sec., was washed with water for 30 sec., and was dried. In this procedure, the sensitivity was defined as the exposure time period (Eop) (ms) to exactly reproduce set dimensions of the mask pattern (0.35-$\mu$m line width with line-and-space (L&S) width of 1:1).

[Definition Evaluation]

The definition was defined as the critical definition at an exposure which reproduced a mask pattern corresponding to 0.35-$\mu$m L&S.

[Focal Depth Range Properties]

1. Dense pattern

A sample was subjected to exposure and development using a reducing-type projection aligner NSR-2005i10D (manufactured by Nikon Corporation, Japan; NA=0.57) at an exposure of Eop [the exposure time period to exactly reproduce the set dimensions of mask pattern (line width 0.35 $\mu$m, L&S=1:1)] as a standard exposure, whereas the focus was shifted up and down at this exposure. The obtained resist pattern was subjected to an SEM (scanning electron microscope) photographic observation. Based upon the SEM photograph, the focal depth range property on dense pattern was defined as the maximum value ($\mu$m) of the focal shift (defocus) to obtain a 0.35-$\mu$m dense pattern with L&S of 1:1 within a variation of ±10% of the set dimensions.

2. Isolation Pattern

A sample was subjected to exposure and development using a reducing-type projection aligner NSR-2005i10D (manufactured by Nikon Corporation, Japan; NA=0.57) at an exposure of Eop [the exposure time period to exactly reproduce the set dimensions of mask pattern (line width 0.35 $\mu$m, L&S=1:1)] as a standard exposure, whereas the focus was shifted up and down at this exposure. The obtained resist pattern was subjected to an SEM photographic observation. Based upon the SEM photograph, the focal depth range property on isolation pattern was defined as the maximum value ($\mu$m) of the focal shift (defocus) to obtain a 0.35-$\mu$m isolation pattern within a variation of ±10% of the set dimensions (0.35 $\mu$m).

[Dimensional Evaluation]

A sample was subjected to exposure and development using a reducing-type projection aligner NSR-2005i10D (manufactured by Nikon Corporation, Japan; NA=0.57) at an exposure of Eop [the exposure time period to exactly reproduce the set dimensions of mask pattern (line width 0.35 $\mu$m, L&S=1:1)] as a standard exposure, whereas the focus was set at zero (when the shift of the focus is nothing). The obtained dense and isolation resist patterns were subjected to an SEM (scanning electron microscope) photographic observation.

TABLE 3

| | Sensitivity (ms) | Definition ($\mu$m) | Focal Depth Range Properties ($\mu$m) | |
|---|---|---|---|---|
| | | | Dense pattern | Isolation pattern |
| Ex. 1 | 320 | 0.32 | 0.8 | 1.2 |
| Ex. 2 | 380 | 0.32 | 1.0 | 1.2 |
| Ex. 3 | 260 | 0.32 | 0.8 | 0.8 |
| Ex. 4 | 200 | 0.35 | 0.8 | 0.8 |
| Ex. 5 | 270 | 0.32 | 0.6 | 0.4 |
| Com. Ex. 1 | 320 | 0.32 | 0.4 | 0.4 |
| Com. Ex. 2 | 460 | 0.32 | 0.4 | 0.2 |
| Com. Ex. 3 | 180 | 0.35 | 0.4 | 0 |

Table 3 shows that the positive photoresist compositions of Examples 1 to 5 using the invented novolak resins (A1, B1, D1, E1 and D2) are satisfactory in focal depth range properties in the formation of dense pattern and isolation pattern of not more than 0.35 $\mu$m, and have satisfactory sensitivity and definition. Furthermore, the novolak resin E1 has a specific ratio of peak intensity and a specific phenol constitutional units and has a ratio of peak intensities varying in each molecular weight fraction.

Table 4

| | 0.35 μm |
|---|---|
| Ex. 1 | |
| Ex. 2 | |
| Ex. 3 | |
| Ex. 4 | |
| Ex. 5 | |

− 56 −
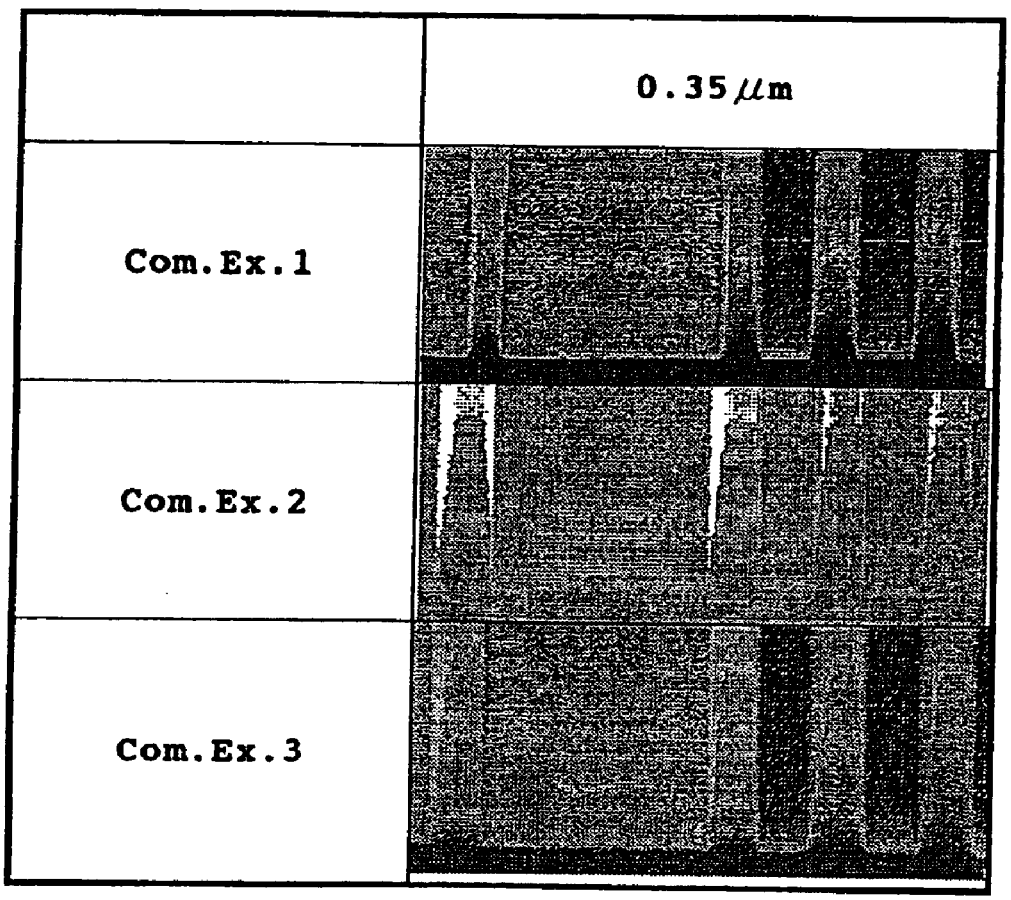

Table 4 shows that the positive photoresist compositions of Examples 1 to 5 can form both dense pattern and isolation pattern with good shapes, as compared with the positive photoresist compositions of Comparative Examples 1 to 3. In the comparison of Example 3 and Example 5, it is found that a positive photoresist composition of Example 3 using a novolak resin D1 which has a specific ratio of peak intensity has a good pattern shape.

ADVANTAGES

The present invention provides positive photoresist compositions that can form both dense pattern and isolation pattern with good phases and have satisfactory sensitivity, definition, and focal depth range properties even in the formation of a fine resist pattern of not more than 0.35 $\mu$m.

Additionally, the present invention provides phenol novolak resins that are advantageous for the preparation of the positive photoresist compositions.

In addition and advantageously, the invention provides phenol novolak resins which include minimized oligonuclear products of phenols and have uniform resin composition both in high molecular weight fractions and in low molecular weight fractions in the production of a phenol novolak resin using two or more types of phenols as materials, and a process for synthetically producing the phenol novolak resins.

Other embodiments and variations will be obvious to those skilled in the art, and this invention is not to be limited to the specific matters stated above.

What is claimed is:

1. A process for producing a phenol novolak resin, comprising the steps of:
    (a) subjecting a phenol to a polycondensation reaction in the presence of an acid catalyst in a reaction system;
    (b) removing water from the reaction system;
    (c) decomposing, in the presence of an acid catalyst, the polycondensation product obtained in the step (b); and
    (d) subjecting the resulting product obtained in step (c) to a polycondensation reaction with an aldehyde or a ketone.

* * * * *